United States Patent
Van Bommel et al.

(10) Patent No.: US 11,906,113 B2
(45) Date of Patent: Feb. 20, 2024

(54) SPIRAL LED FILAMENT LAMP WITH A CYLINDRICAL TWO-DIMENSIONAL FLEXIBLE PRINTED CIRCUIT BOARD (PCB) AND A METHOD OF PRODUCING A SPIRAL LED FILAMENT WITH A CYCLINDRICAL TWO-DIMENSIONAL FLEXIBLE PRINTED CIRCUIT BOARD (PCB)

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/775,433

(22) PCT Filed: Nov. 3, 2020

(86) PCT No.: PCT/EP2020/080719
§ 371 (c)(1),
(2) Date: May 9, 2022

(87) PCT Pub. No.: WO2021/094124
PCT Pub. Date: May 20, 2021

(65) Prior Publication Data
US 2022/0381404 A1    Dec. 1, 2022

(30) Foreign Application Priority Data
Nov. 11, 2019 (EP) ..................... 19208236

(51) Int. Cl.
*F21K 9/232*    (2016.01)
*F21K 9/238*    (2016.01)

(52) U.S. Cl.
CPC .............. *F21K 9/232* (2016.08); *F21K 9/238* (2016.08)

(58) Field of Classification Search
CPC ...... F21K 9/232; F21K 9/238; F21Y 2107/30; F21Y 2107/70
See application file for complete search history.

(56) References Cited

U.S. PATENT DOCUMENTS 6,580,228 B1    6/2003   Chen et al.
11,187,387 B1 *  11/2021  Yan ........................ F21K 9/238
(Continued)

FOREIGN PATENT DOCUMENTS

CN    103277678 A    9/2013
CN    203363808 U    12/2013
(Continued)

*Primary Examiner* — Tracie Y Green (57) ABSTRACT

The present invention relates to an LED filament lamp (10) comprising a two-dimensional flexible printed circuit board (100), PCB, having a first and a second opposing connection end portions (110, 120). The two-dimensional flexible PCB (100) comprises a plurality of filaments lines (130*a-d*) extending from the first connection end portion (110) to the second connection end portion (120), wherein each filament line (130*a*) comprises an array of LEDs ($130_{a1}$-$130_{aN}$). The two-dimensional flexible PCB (100) is arranged in a cylinder shape by connecting the first and the second opposing connection end portions (110, 120) such that each (130*a*) of the plurality of filament lines (130*a-d*) is connected to another (130*b*) one of the plurality of filament lines (130*a-d*) thereby a spiral LED filament (150) is formed by the plurality of filament lines (130*a-d*).

15 Claims, 7 Drawing Sheets

(56) References Cited

U.S. PATENT DOCUMENTS

| | | | |
|---|---|---|---|
| 2006/0071349 A1* | 4/2006 | Tokushige | H01L 25/0655 |
| | | | 257/784 |
| 2011/0019433 A1 | 1/2011 | Dussault | |
| 2014/0268740 A1* | 9/2014 | Veres | H05K 1/0209 |
| | | | 362/249.06 |
| 2015/0267872 A1* | 9/2015 | Huang | H05K 1/00 |
| | | | 362/249.06 |
| 2017/0012177 A1* | 1/2017 | Trottier | F21K 9/00 |
| 2019/0277484 A1 | 9/2019 | Kwisthout | |
| 2020/0332962 A1* | 10/2020 | Chen | H05B 45/20 |

FOREIGN PATENT DOCUMENTS

| | | |
|---|---|---|
| CN | 204554464 U | 8/2015 |
| CN | 106949385 A | 7/2017 |
| CN | 206429903 U | 8/2017 |
| CN | 208967488 U | 6/2019 |
| EP | 1681010 A1 | 7/2006 |
| JP | 2005125010 A | 5/2005 |
| JP | 2013016493 A | 1/2013 |
| JP | 2017004590 A | 1/2017 |
| JP | 2017517126 A | 6/2017 |
| WO | 2012096460 A1 | 7/2012 |

* cited by examiner

SPIRAL LED FILAMENT LAMP WITH A CYLINDRICAL TWO-DIMENSIONAL FLEXIBLE PRINTED CIRCUIT BOARD (PCB) AND A METHOD OF PRODUCING A SPIRAL LED FILAMENT WITH A CYCLINDRICAL TWO-DIMENSIONAL FLEXIBLE PRINTED CIRCUIT BOARD (PCB)

CROSS-REFERENCE TO PRIOR APPLICATIONS

This application is the U.S. National Phase application under 35 U.S.C. § 371 of International Application No. PCT/EP2020/080719, filed on Nov. 3, 2020, which claims the benefit of European Patent Application No. 19208236,0, filed on Nov. 11, 2019. These applications are hereby incorporated by reference herein.

FIELD OF THE INVENTION

The invention relates to an LED filament lamp and a method of producing a spiral LED filament.

BACKGROUND OF THE INVENTION

Over the past years, various types of lamps have been developed using LED filaments. An example of such lamps is retrofit lamps which make use of the infrastructure for producing incandescent lamps based on glass and replace the filament with LED. For instance, incandescent lamps have been developed comprising LED filaments. It is nevertheless desired to improve manufacturing of such LED filament lamps.

SUMMARY OF THE INVENTION

It is an object of the present invention to overcome at least some of the above problems.

According to a first aspect of the present inventive concept, this and other objects are achieved by providing an LED filament lamp comprising a two-dimensional flexible printed circuit board (PCB), having a first and a second opposing connection end portions. The two-dimensional flexible PCB comprises a plurality of filaments lines extending from the first connection end portion to the second connection end portion, wherein each filament line comprises an array of LEDs. The two-dimensional flexible PCB is arranged in a cylinder shape by connecting the first and the second opposing connection end portions such that each of the plurality of filament lines is connected to another one of the plurality of filament lines. Thereby a spiral LED filament is formed by the plurality of filament lines.

The two-dimensional flexible PCB facilitates formation of the LED filament lamp. This is since the two-dimensional flexible PCB acts as a carrier for the plurality of filament lines. Thereby, the plurality of filament lines may be arranged or formed e.g. printed on the two-dimensional flexible PCB. The two-dimensional flexible PCB may preferably comprise 3 to 10 filament lines. The two-dimensional flexible PCB may more preferably comprise 4 to 8 filament lines. The two-dimensional flexible PCB may most preferably comprise 5 to 7 filament lines. Each filament line preferably gives a continuous line of light in the on mode i.e. no individual LEDs is seen as a light spot. Each filament line may preferably comprise at least 10 LEDs. Each filament line may more preferably comprises at least 13 LEDs. Each filament line may most preferably comprise at least 15 LEDs. The plurality of filament lines may be arranged or formed in any shape or pattern on the two-dimensional flexible PCB. The arrangement of the two-dimensional flexible PCB in a cylinder shape by connecting the first and the second opposing connection end portions allows to mechanically connect the first and the second opposing connection end portions. In addition, connecting each of the plurality of filament lines to another one of the plurality of filament lines allows to electrically connect the plurality of filament lines i.e. it allows to electrically connect the arrays of LEDs of the plurality of filament line to form the spiral LED filament. Thereby, a single spiral LED filament is formed which may provide LED filament light. The spiral LED filament may look like a spring formed around the two-dimensional flexible PCB. The spiral LED filament preferably gives a continuous line of light in the on mode such that almost no dark gaps is visible between the filament lines.

By "an LED filament lamp" is hereby meant a lamp which provides LED filament lamp light. The LED filament lamp may further comprise an envelope, a cap, a driver, a controller, and an antenna.

By a two-dimensional flexible PCB is hereby meant a two-dimensional carrier comprising conductive tracks. For instance, the two-dimensional flexible PCB may be formed of an electrically insulating carrier comprising electrically conductive tracks. Another example, the two-dimensional flexible PCB may be formed of a thermally conductive layer comprising an electrically insulating carrier and electrically conductive tracks. The two-dimensional flexible PCB may preferably be light transmissive of light. The two-dimensional flexible PCB may more preferably be translucent. The two-dimensional flexible PCB may most preferably be transparent.

By an LED filament is hereby meant an LED filament which provides an LED filament light and comprises a plurality of light emitting diodes (LEDs) arranged in a linear array. Preferably, the LED filament has a length L and a width W, wherein L>5W. The LED filament may be arranged in a straight configuration or in a non-straight configuration such as for example a curved configuration.

The LED filament may comprise an encapsulant at least partly covering at least part of the plurality of LEDs. The encapsulant may be a polymer material which may be flexible such as for example a silicone. Further, the LEDs may be arranged for emitting LED light e.g. of different colors or spectrums. The encapsulant may comprise a luminescent material that is configured to at least partly convert LED light into converted light. The luminescent material may be a phosphor such as an inorganic phosphor and/or quantum dots or rods. The LED filament provides LED filament light. The LED filament light comprises light emitted by the LED filament and/or the converted LED light such as light received from other lamps.

The plurality of filament lines may be parallelly arranged on the two-dimensional flexible PCB. The parallel arrangement of the plurality of filament lines may facilitate forming the spiral LED filament. The plurality of filament lines may alternatively be arranged in a meander shape.

An end of a filament line of the plurality of filament lines arranged at the first connection end portion may be connected to a beginning of an adjacent filament line of the plurality of filament lines arranged at the second connection end portion. An end of a filament line of the plurality of filament lines arranged at the first connection end portion may be electrically connected to a beginning of an adjacent filament line of the plurality of filament lines arranged at the second connection end portion. Thereby the plurality of filament lines may be arranged in series such that a beginning of a first filament line of the plurality of filament lines arranged at the first connection end portion and an end of a last filament line of the plurality of filament lines arranged at the second connection end portion may provide electricity to the plurality of filament lines. Alternatively, the LED filament lamp may comprise two connectors such that one connector connects beginnings of the plurality of filament lines arranged at the first connection end portion and another connector connecting ends of the plurality of filament lines arranged at the second connection end portion. Thereby the two connectors may provide electricity to the plurality of filament lines.

The plurality of filament lines may have the same width. The same width of the plurality of filament lines may facilitate connecting the beginnings and ends of the adjacent filament lines. The plurality of filament lines may have a width smaller than a width of the two dimensional flexible PCB. The plurality of filament lines may have the same width as the two dimensional flexible PCB. The plurality of filament lines may have a width larger than a width of the two dimensional flexible PCB.

The plurality of filament lines may be linear. The linearity of the plurality of filament lines may facilitate formation of the spiral LED filament. The plurality of filament lines may be slightly shaped. For instance, the plurality of filament lines may be slightly curved. Thereby LED filament lamps with various looks may be formed which may be desired for decorative purposes.

The plurality of filament lines may be diagonally arranged on the two-dimensional flexible PCB. The diagonal arrangement of the plurality of the filament lines may facilitate formation of the spiral LED filament. By diagonal is hereby meant that the plurality of filament lines are arranged with an angle with respect to the first and the second opposing connection end portions. The plurality of filament lines may preferably be arranged with an angle in a range of 45 to 85° with respect to the first and the second opposing connection end portions. The plurality of filament lines may more preferably be arranged with an angle in a range of 50 to 82° with respect to the first and the second opposing connection end portions. The plurality of filament lines may most preferably be arranged with an angle in a range of 55 to 80° with respect to the first and the second opposing connection end portions. The plurality of filament lines may not be diagonally arranged on the two-dimensional flexible PCB.

An end of a filament line of the plurality of filament lines may be arranged at a same vertical position at the first connection end portion as a beginning of an adjacent filament line of the plurality of filament lines at the second connection end portion. In other words, by arranging the two-dimensional flexible PCB in the cylinder shape, the end of a filament line of the plurality of filament lines may be arranged at the same vertical position at the first connection end portion as the beginning of an adjacent filament line of the plurality of filament lines at the second connection end portion. Thereby the formation of the spiral LED filament may be facilitated.

Each filament line may comprise an encapsulant covering the array of LEDs, the encapsulant comprising a luminescent material and/or a light scattering material e.g. $BaSO_4$, $TiO_2$ and/or $Al_2O_3$. The encapsulant may also cover portions of the two-dimensional flexible PCB arranged between the LEDs of the array of LEDs of each filament line. For instance, the encapsulant may form a line covering the array of LEDs of each filament line and the portions of the two-dimensional flexible PCB arranged between the LEDs. The encapsulant may have an elongated shape e.g. an oval shape covering each LED of the array of LEDs and two neighboring portions of the two-dimensional flexible PCB surrounding the LED. This may in turn result into a line emission of each filament line i.e. the array of LEDs of each filament line looks like a line when illuminated. Thereby, the plurality of filament lines may look like a spiral when illuminated.

The first connection end portion may comprise a filament line free zone extending from beginnings of the plurality of filament lines and an end of the first connection end portion. The second connection end portion may comprise a filament line free zone extending from ends of the plurality of filament lines and an end of the second connection end portion. In other words, the two-dimensional flexible PCB may comprise two filament line free zones arranged adjacent to the ends of the first and the second connection end portions. Thereby the two-dimensional flexible PCB may be arranged in the cylinder shape by folding the two filament line free zones inwards i.e. towards an inner space of the cylinder. This may in turn improve safety and/or reliability of the LED filament lamp.

The two-dimensional flexible PCB may comprise at least four filaments lines. The two-dimensional flexible PCB may comprise any number of filaments lines.

According to a second aspect of the present inventive concept, there is provided a method for producing a spiral LED filament. The method comprises providing a two-dimensional flexible printed circuit board, PCB, having a first and a second opposing connection end portions, the two-dimensional flexible PCB comprises a plurality of filament lines extending from the first connection end portion to the second connection end portion, wherein each filament line comprises an array of LEDs. The method further comprises arranging the two-dimensional flexible PCB in a cylinder shape by mechanically connecting the first and the second opposing connection end portions such that each of the plurality of filament lines is connected to another one of the plurality of filament lines thereby forming the spiral LED filament. This aspect may generally present the same or corresponding advantages as the former aspect.

The step of providing may comprise mechanically arranging the array of LEDs of the plurality of filaments lines on the two-dimensional flexible PCB, and electrically interconnecting the LEDs of each array of LEDs. The array of LEDs of the plurality of filaments lines may be arranged on an outer surface of the two-dimensional flexible PCB i.e. an outer surface of the cylinder. Alternatively, or in combination, the array of LEDs of the plurality of filaments lines may be arranged on an inner surface of the two-dimensional flexible PCB i.e. an inner surface of the cylinder. The arrangement of the array of LEDs of the plurality of filaments lines on the outer surface of the cylinder may provide a higher contrast than the arrangement of the array of LEDs of the plurality of filaments lines on the inner surface of the cylinder. By the arrangement of the array of LEDs of the plurality of filaments lines on the outer surface of the cylinder, almost all the light emitted by the array of LEDs may be emitted in a direction away from the cylinder. The arranging of the array of LEDs of the plurality of filaments lines on the inner surface of the two-dimensional flexible PCB may be preferred when the two-dimensional flexible PCB is light transmissive. The step of providing may further dispensing an encapsulant covering each LED of the array of LEDs. The dispensing of the encapsulant may present same advantages as described above.

Connecting the first and the second opposing connection end portions may comprise electrically connecting each of the plurality of filament lines to another one of the plurality of filament lines. Thereby the step of arranging the two-dimensional flexible PCB in the cylinder shape may electrically connect each of the plurality of filament lines to another one of the plurality of filament lines.

A further scope of applicability of the present invention will become apparent from the detailed description given below. However, it should be understood that the detailed description and specific examples, while indicating preferred embodiments of the invention, are given by way of illustration only, since various changes and modifications within the scope of the invention will become apparent to those skilled in the art from this detailed description.

Hence, it is to be understood that this invention is not limited to the particular component parts of the device described or steps of the methods described as such device and method may vary. It is also to be understood that the terminology used herein is for purpose of describing particular embodiments only and is not intended to be limiting. It must be noted that, as used in the specification and the appended claim, the articles "a," "an," and "the" are intended to mean that there are one or more of the elements unless the context clearly dictates otherwise. Thus, for example, reference to "a device" or "the device" may include several devices, and the like. Furthermore, the words "comprising", "including", "containing" and similar wordings does not exclude other elements or steps.

BRIEF DESCRIPTION OF THE DRAWINGS

The above and other aspects of the present invention will now be described in more detail, with reference to the appended figures showing embodiments of the invention. The figures describe an LED filament lamp. However, the figures should not be considered limiting the invention to the lamps; instead they are used for explaining and understanding the invention.

As illustrated in the figures, the sizes of components are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
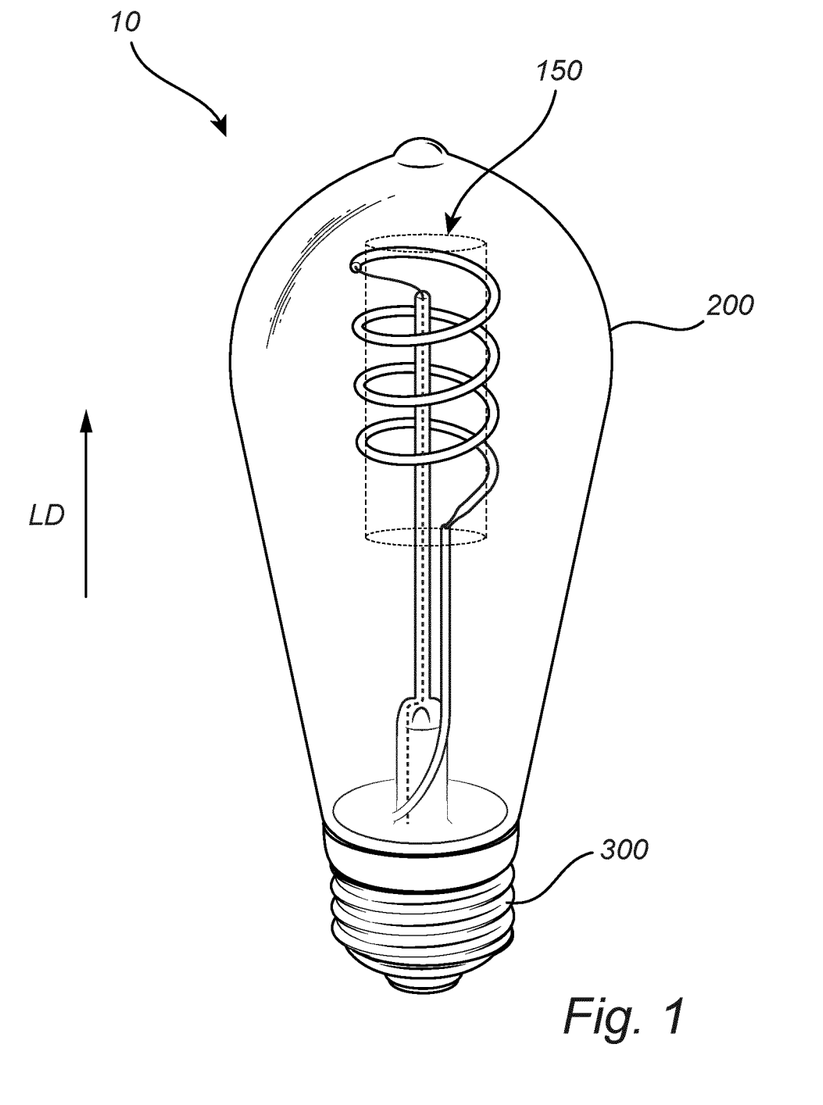
FIG. 1 illustrates a perspective view of an LED filament lamp comprising a spiral LED filament.

In connection with FIG. 1, a lamp 10 is illustrated. LD denotes a longitudinal direction of the lamp 10. FIG. 1 shows that the lamp 10 comprises an envelope 200. The envelope 200 shown in FIG. 1 looks similar to bulbs of the incandescent lamps. The envelope 200, shown in FIG. 1, has an elongated shape. The envelope 200 may have other shapes. The envelope 200 shown in FIG. 1 is formed of glass. The envelope 200 may be formed of various materials. The envelope 200 may be formed in a manner which per se is known in the art.

FIG. 1 further shows that the lamp 10 may comprise a cap 300. A neck portion of the envelope 200 may be connected to the cap 300. The cap 300 allow the lamp 10 to be safely and conveniently connected to a lamp holder. The cap 300 may mechanically and electrically connect the LED filament lamp to a luminaire socket. The cap 300 may comprise electronic components for e.g. providing electricity to LEDs. For instance, the cap 300 may comprise a driver. The driver may adapt the current. For instance, the driver may adapt AC current to DC current. The cap may further comprise a controller. The controller may control current provided to LEDs. The cap may further comprise an antenna. The antenna may send and/or receive data.

FIG. 1 further shows that the lamp 10 comprises a spiral LED filament 150. The spiral LED filament 150 is formed by arranging a two-dimensional flexible PCB 100 in a cylinder shape. FIG. 1 shows that the spiral LED filament 150 extends along the longitudinal direction LD of the lamp 10. The two-dimensional flexible PCB 100 is described in connection with FIGS. 2-5.

Figure 2:
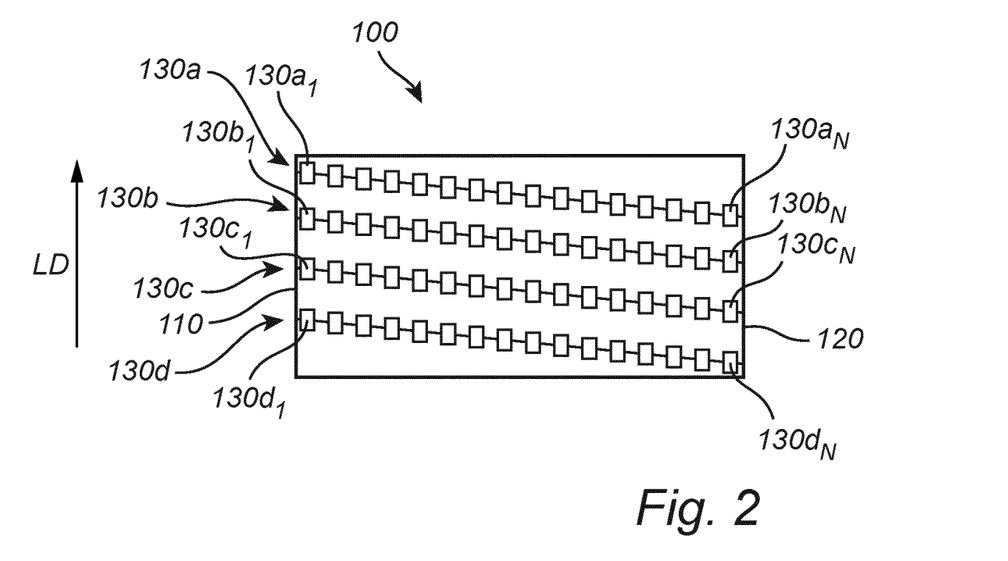
FIGS. 2-5 illustrate four two-dimensional flexible PCBs, each comprising a plurality of filament lines.

In connection with FIG. 2, a two-dimensional flexible PCB 100 is shown. FIG. 2 shows that the two-dimensional flexible PCB 100 has an equiangular quadrilateral shape i.e. a rectangular shape. The two-dimensional flexible PCB 100 comprises a first and a second opposing connection end portions 110, 120. FIG. 2 shows that the first and the second opposing connection end portions 110, 120 are the two shorter opposing sides of the rectangle. The two-dimensional flexible PCB 100 may have other shapes. For instance, the two-dimensional flexible PCB 100 may have a quadrilateral shape such as a parallelogram. A typical height of the two-dimensional flexible PCB 100 along the longitudinal direction LD of the lamp 10 may be in a range of 30 to 150 mm. A typical width of the two-dimensional flexible PCB 100 along a direction perpendicular to the longitudinal direction LD of the lamp 10 may be in a range of 60 to 200 mm. The two-dimensional flexible PCB 100 may be made of a polymer such as poly imide (PI) or poly ethene terephthalate (PET) or a metal e.g. a film or a foil.

Still in connection with FIG. 2, the two-dimensional flexible PCB 100 comprises a plurality of filaments lines 130a-d. Two-dimensional flexible PCB 100 may comprise at least four filaments lines 130a-d. Each of the plurality of filament lines 130a-d extend from the first connection end portion 110 to the second connection end portion 120. Each filament line 130a of the plurality of filament lines 130a-d comprises an array of LEDs $130a_1$-$130a_N$. The plurality of filaments lines 130a-d may be provided by mechanically arranging the array of LEDs $130a$-$d_{1-N}$ on the two-dimensional flexible PCB 100. The LEDs of each array of LEDs $130a_1$-$130a_N$ may further be electrically connected.

Still in connection with FIG. 2, each filament line 130a of the plurality of filament lines 130a-d may comprise an encapsulant covering the array of LEDs $130a_1$-$130a_N$. The encapsulant may be dispensed covering each LED of the array of LEDs ($130a_1$-$130a_N$). The encapsulant may comprise a luminescent material and/or a light scattering material. The encapsulant may also cover portions of the two-dimensional flexible PCB arranged between the LEDs of the array of LEDs of each filament line. This may result into that the array of LEDs of each filament line 130a may look like a line when illuminated. The LEDs may be blue and/or UV LEDs. In the case of blue and/or UV LEDs, the encapsulant may preferably comprise a luminescent material. In the case of having only UV LEDs, the luminescent material may comprise any of or any combination of blue, yellow, green, and red phosphor materials. In the case of having only blue LEDs, the luminescent material may comprise any of or any combination of yellow, green, and red phosphor materials. The LEDs may also comprise red, green and blue (RGB) LEDs. The RGB LEDs may generate together a white light. LEDs and/or filament lines emitting different colours and/or colour temperatures may be controlled individually by a controller to tune the colour temperature.

Still in connection with FIG. 2, the plurality of filament lines 130a-d are linear. The plurality of filament lines 130a-d may be non-linearly arranged. For instance, the plurality of filament lines 130a-d may be arranged in curved lines. FIG. 2 further shows that the plurality of filament lines 130a-d are parallelly arranged on the two-dimensional flexible PCB 100. The plurality of filament lines may be arranged in other shapes on the two-dimensional flexible PCB 100. For instance, the plurality of filament lines may be arranged in a meander shape on the two-dimensional flexible PCB 100. FIG. 2 further shows that the plurality of filament lines 130a-d are diagonally arranged on the two-dimensional flexible PCB 100. In other words, the plurality of filament lines 130a-d are neither parallel nor perpendicular with respect to the first and the second opposing end portion 110, 120. The plurality of filament lines 130a-d may be arranged with various angles with respect to the first and the second opposing end portion 110, 120.

Figure 3:
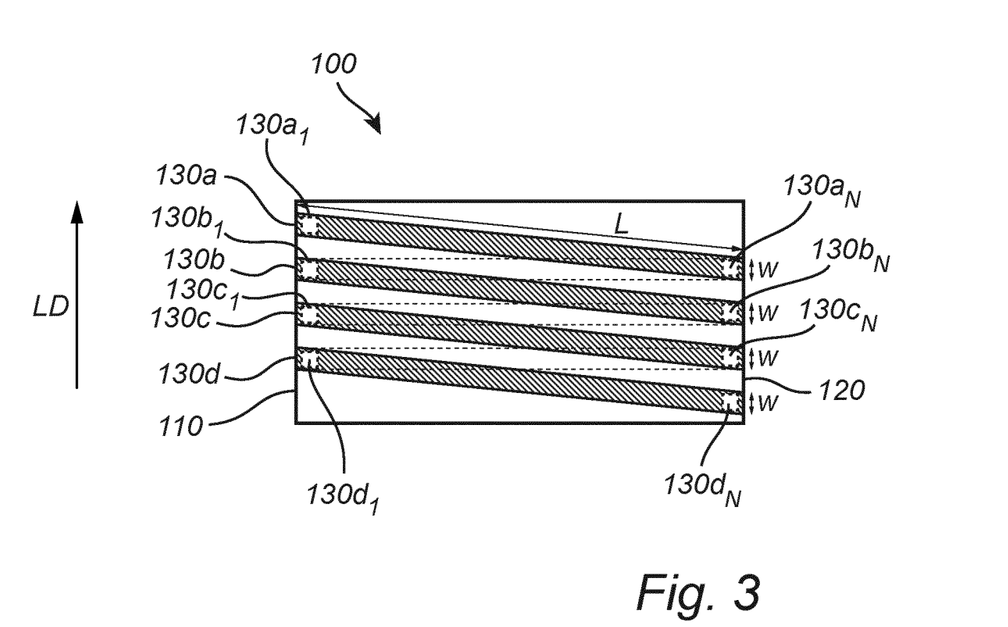

In connection with FIG. 3, the plurality of filament lines 130a-d are shown as lines i.e. the array of LEDs of each filament line is not shown. FIG. 3 further shows that the plurality of filament lines 130a-d have the same width W and the same length L. The width of the plurality of filament lines 130a-d may be in a range of 0.5 to 4 mm, more preferably in a range of 1 to 3 mm such as 2 mm. A distance between the two adjacent filament lines 130 along the longitudinal direction LD of the lamp 10 may be in a range of 2×W to 10×W. The length L of the plurality of filament lines 130a-d may be larger than the width W of the plurality of filament lines 130a-d. The length L of the plurality of filament lines 130a-d may preferably be 10 times larger than the width W of the plurality of filament lines 130a-d. The length L of the plurality of filament lines 130a-d may more preferably be 13 times larger than the width W of the plurality of filament lines 130a-d. The length L of the plurality of filament lines 130a-d may most preferably be 15 times larger than the width W of the plurality of filament lines 130a-d. The length L of the plurality of filament lines 130a-d may preferably be in a range of 3 to 20 cm. The length L of the plurality of filament lines 130a-d may more preferably be in a range of 4 to 15 cm. The length L of the plurality of filament lines 130a-d may most preferably be in a range of 5 to 12 cm.

Still in connection with FIG. 3, an end of a filament line $130a_N$ of the plurality of filament lines 130a-d is arranged at a same vertical position at the first connection end portion 110 as a beginning of an adjacent filament line $130b_1$ of the plurality of filament lines 130a-d at the second connection end portion 120. In FIG. 3, the vertical positions of the end of the filament line $130a_N$ and the beginning of the adjacent filament line $130b_1$ are shown by dashed lines.

Figure 4:
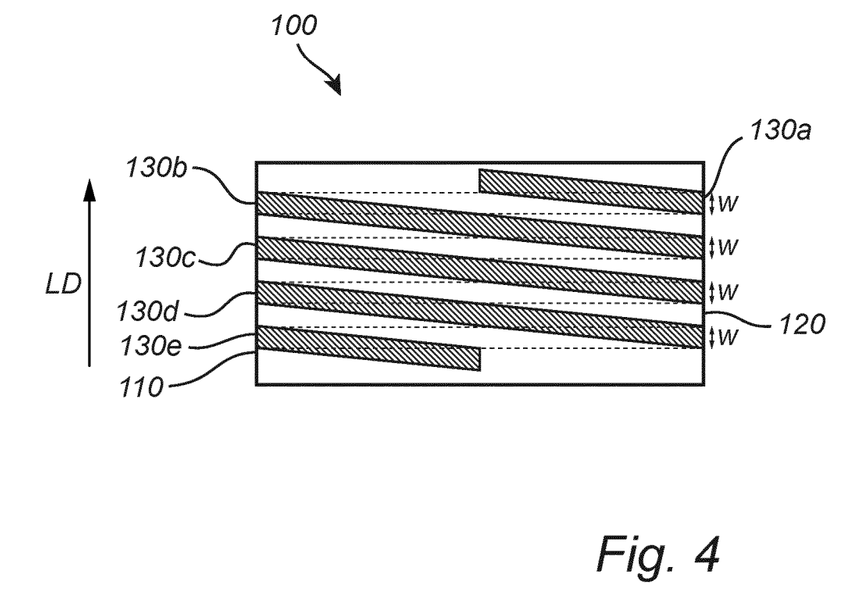

In connection with FIG. 4, the plurality of filament lines 130a-d do not have the same length L, as in FIG. 3. FIG. 4 shows that the filament line 130a and the filament line 130e have a shorter length compared to the filament lines 130b-d.

Figure 5:
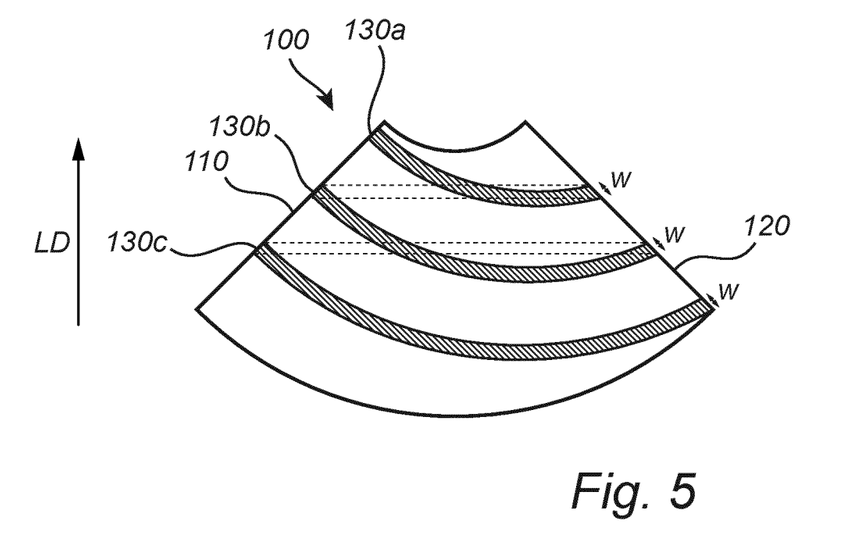

In connection with FIG. 5, the two-dimensional flexible PCB 100 in the form of a block arc. FIG. 5 further shows that the plurality of filament lines 130a-d are curved. FIG. 5 further shows that the plurality of filament lines 130a-d have the same width W and different lengths L. FIG. 5 further shows that an end of a filament line $130a_N$ of the plurality of filament lines 130a-d is arranged at a same vertical position at the first connection end portion 110 as a beginning of an adjacent filament line $130b_1$ of the plurality of filament lines 130a-d at the second connection end portion 120.

In connection with FIGS. 6-11, the two-dimensional flexible PCB 100 is arranged in a cylinder shape. This is done by connecting the first and the second opposing connection end portions 110, 120 such that each 130a of the plurality of filament lines 130a-d is connected to another 130b one of the plurality of filament lines 130a-d. Thereby a spiral LED filament 150 is formed by the plurality of filament lines 130a-d. The arrangement of the two-dimensional flexible PCB 100 in a cylinder shape in the cylinder shape may be performed such that the plurality of filament lines 130a-d may be arranged on an outer surface of the cylinder. The arrangement of the two-dimensional flexible PCB 100 in a cylinder shape may be performed such that the plurality of filament lines 130a-d may be arranged on an inner surface of the cylinder. In the following, each of the FIGS. 6-11 will be described in details.

Figure 6:
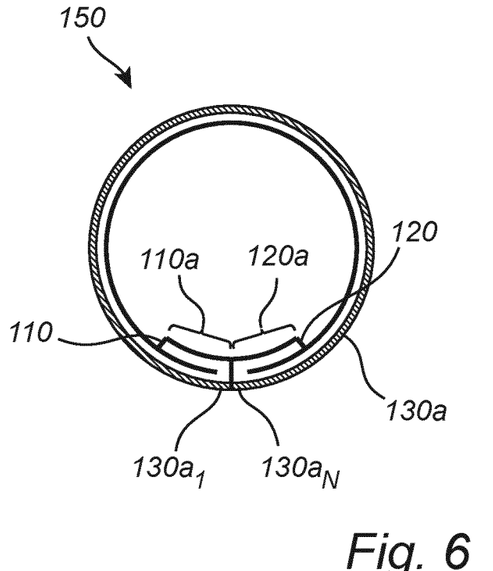
FIGS. 6 and 7 respectively illustrate a top and a perspective view of a spiral LED filament.

In connection with FIG. 6, a top view of a spiral LED filament 150 is shown. FIG. 6 further shows that the first connection end portion 110 comprise a filament line free zone 110a extending from beginnings $130a-d_1$ of the plurality of filament lines 130a-d and an end of the first connection end portion 110. FIG. 6 further shows that the second connection end portion 120 comprises a filament line free zone 120a extending from ends $130a-d_N$ of the plurality of filament lines 130a-d and an end of the second connection end portion 120. The filament line free zones 110a and 120a are folded inwards i.e. towards an inner space of the cylinder.

Figure 7:
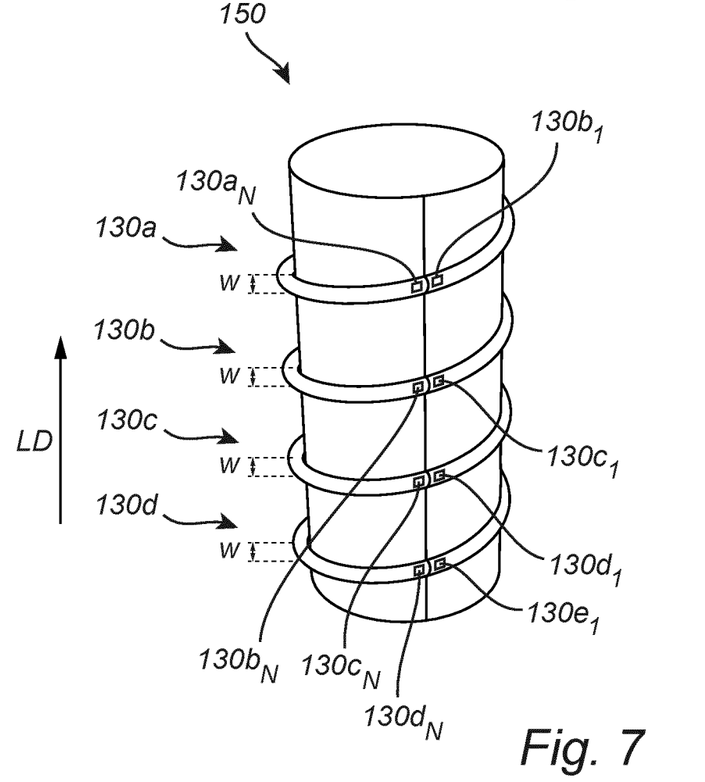

In connection with FIG. 7, a perspective view of a spiral LED filament 150 is shown. In FIG. 7, the two-dimensional flexible PCB 100 is arranged in a cylinder shape by mechanically connecting the first and the second opposing connection end portions 110, 120. In FIG. 7, each of the plurality of filament lines 130a-d is electrically connected to another one of the plurality of filament lines 130a-d. In FIG. 7, an end of a filament line of the plurality of filament lines 130a-d arranged at the first connection end portion 110 is connected to a beginning of an adjacent filament line of the plurality of filament lines 130a-d arranged at the second connection end portion 120. For instance, an end $130a_N$ of the filament line 130a is connected to the beginning $130b_1$ of the adjacent filament line 130b. Another example, an end $130b_N$ of the filament line 130b is connected to the beginning $130c_1$ of the adjacent filament line 130c.

Figure 8:
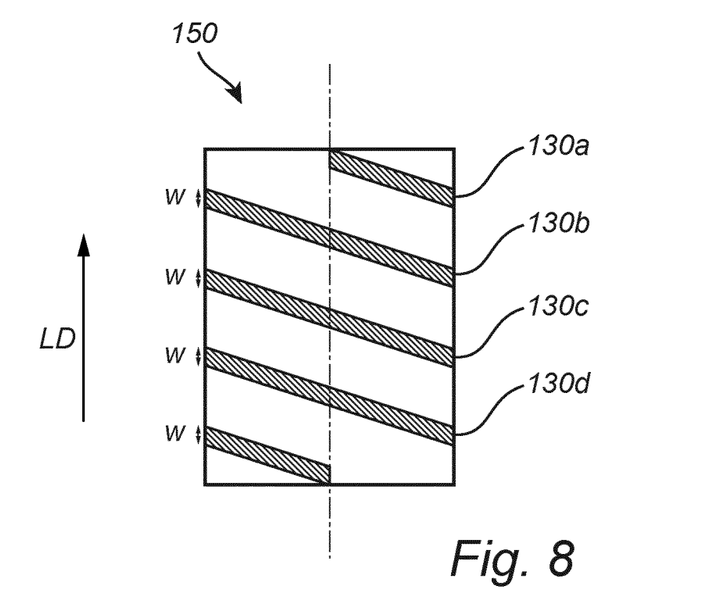
FIGS. 8-11 illustrate side views of four spiral LED filaments.

In connection with FIG. 8, a side view of another spiral LED filament 150 is shown. In FIG. 8, a beginning of a filament line 130a and an end of the filament line 130d are not connected another filament line. These two ends may be connected to electricity, as shown e.g. in FIG. 1.

Figure 9:
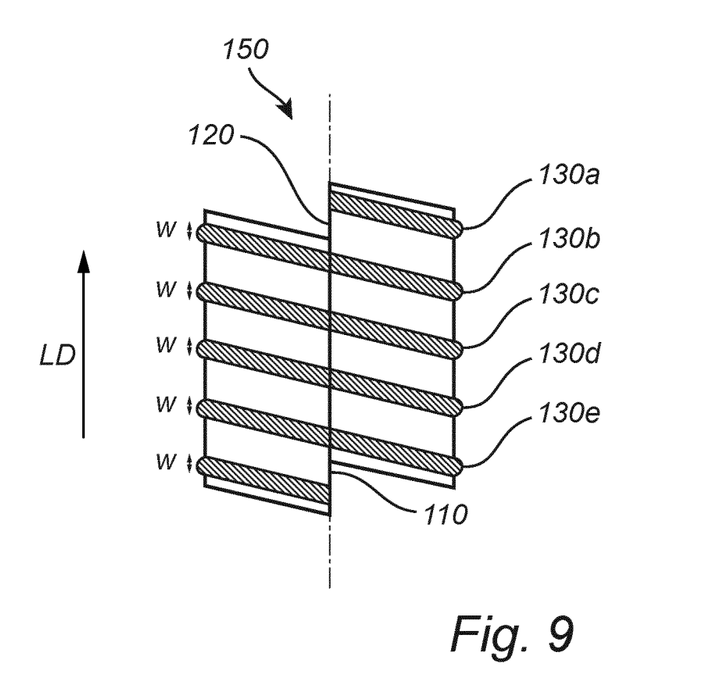

In connection with FIG. 9, a side view of yet another spiral LED filament 150 is shown. In FIG. 9, the first and the second opposing connection end portions 110, 120 are slightly misaligned. In other words, a portion of the first opposing connection end portion 110 and a portion of the second opposing connection end portion 120 are mechanically arranged to form a cylinder shape. In this case, the plurality of filament lines 130a-e may be diagonally or non-diagonally arranged on the two-dimensional flexible PCB.

Figure 10:
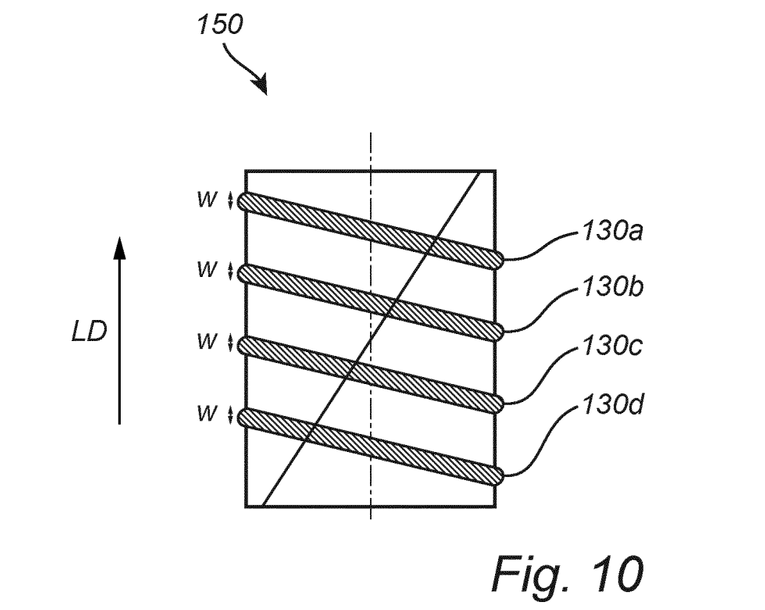

In connection with FIG. 10, a side view of yet another spiral LED filament 150 is shown. The spiral LED filament shown in FIG. 10 may e.g. be formed by arranging a two-dimensional flexible PCB 100 having a parallelogram shape in a cylinder shape. The spiral LED filament shown in FIG. 10 may e.g. be formed by arranging the plurality of filament lines 130-d slightly shifted with respect to one another.

Figure 11:
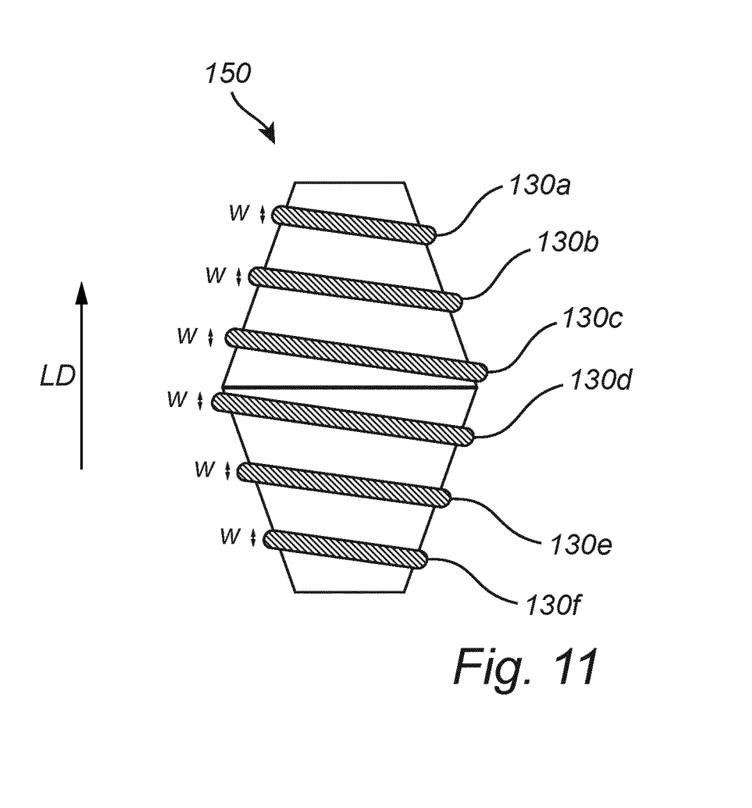

In connection with FIG. 11, a side view of yet another spiral LED filament 150 is shown. The spiral LED filament shown in FIG. 10 may e.g. be formed by arranging two of the block arc shaped two-dimensional flexible PCBs 100 shown in FIG. 5.

Figure 12:
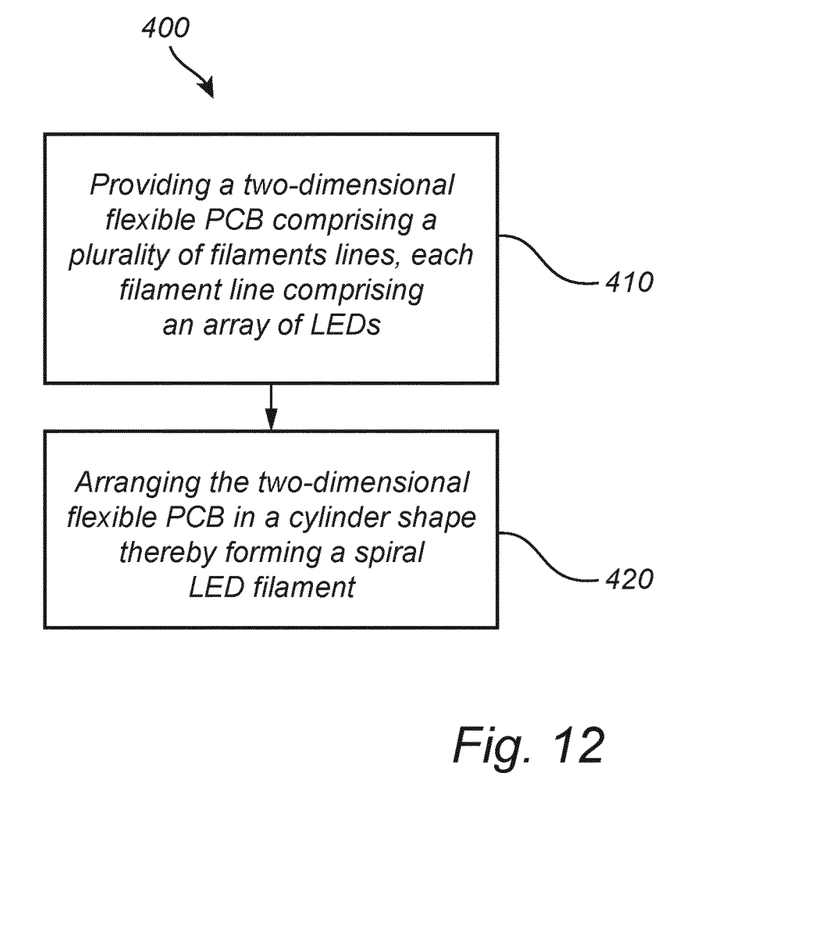
FIG. 12 illustrates a block scheme of a method of producing a spiral LED filament.

In connection with FIG. 12, a block scheme of a method 400 of producing a spiral LED filament is shown. The method 400 comprises providing 410 a two-dimensional flexible PCB 100 having a first and a second opposing connection end portions 110,120. The two-dimensional flexible PCB 100 comprises a plurality of filaments lines 130a-d extending from the first connection end portion 110 to the second connection end portion 120, wherein each filament line 130a comprises an array of LEDs $130a_1$-$130a_N$. The method 400 further comprises arranging 420 the two-dimensional flexible PCB 100 in a cylinder shape by mechanically connecting the first and the second opposing connection end portions 110, 120 such that each 130a of the plurality of filament lines 130a-d is connected to another 130b one of the plurality of filament lines 130a-d thereby forming the spiral LED filament 150.

The step of providing 410 may comprise mechanically arranging the array of LEDs $130a$-$d_{1-N}$ of the plurality of filaments lines 130a-d on the two-dimensional flexible PCB 100. The step of providing 410 may further comprise electrically interconnecting the LEDs of each array of LEDs $130a_1$-$130a_N$. The step of providing 410 may further comprise dispensing an encapsulant covering each LED of the array of LEDs $130a_1$-$130a_N$.

Still in connection with FIG. 12, connecting the first and the second opposing connection end portions 110, 120 may comprise electrically connecting each 130a of the plurality of filament lines 130a-d to another one 130b of the plurality of filament lines 130a-d.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. An LED filament lamp comprising:
    a two-dimensional flexible printed circuit board, PCB, having a first and a second opposing connection end portions, the two-dimensional flexible PCB comprises a plurality of filaments lines extending from the first connection end portion to the second connection end portion, wherein each filament line comprises an array of LEDs,
    wherein the two-dimensional flexible PCB is arranged in a cylinder shape by connecting the first and the second opposing connection end portions such that each of the plurality of filament lines is connected to another one of the plurality of filament lines thereby a spiral LED filament is formed by the plurality of filament lines.

2. The LED filament lamp according to claim 1, wherein the plurality of filament lines are parallelly arranged on the two-dimensional flexible PCB.

3. The LED filament lamp according to claim 1, wherein an end of a filament line of the plurality of filament lines arranged at the first connection end portion is connected to a beginning of an adjacent filament line of the plurality of filament lines arranged at the second connection end portion.

4. The LED filament lamp according to any claim 1, wherein the plurality of filament lines have the same width (W).

5. The LED filament lamp according to claim 1, wherein the plurality of filament lines are linear.

6. The LED filament lamp according to claim 1, wherein the plurality of filament lines are diagonally arranged on the two-dimensional flexible PCB.

7. The LED filament lamp according to claim 6, wherein an end of a filament line of the plurality of filament lines is arranged at a same vertical position at the first connection end portion as a beginning of an adjacent filament line of the plurality of filament lines at the second connection end portion.

8. The LED filament lamp according to claim 1, wherein each filament line comprises an encapsulant covering the array of LEDs, the encapsulant comprising a luminescent material and/or a light scattering material.

9. The LED filament lamp according to claim 1, wherein the first connection end portion comprises a filament line free zone extending from beginnings of the plurality of filament lines and an end of the first connection end portion.

10. The LED filament lamp according to claim 1, wherein the second connection end portion comprises a filament line free zone extending from ends of the plurality of filament lines and an end of the second connection end portion.

11. The LED filament lamp according to claim 1, wherein the two-dimensional flexible PCB comprises at least four filaments lines.

12. A method of producing a spiral LED filament, the method comprising:
    providing a two-dimensional flexible printed circuit board, PCB, having a first and a second opposing connection end portions, the two-dimensional flexible PCB comprises a plurality of filaments lines extending from the first connection end portion to the second connection end portion, wherein each filament line comprises an array of LEDs, and
    arranging the two-dimensional flexible PCB in a cylinder shape by mechanically connecting the first and the second opposing connection end portions such that each of the plurality of filament lines is connected to another one of the plurality of filament lines thereby forming the spiral LED filament.

13. The method according to claim 12, wherein the step of providing comprises:
    mechanically arranging the array of LEDs of the plurality of filaments lines on the two-dimensional flexible PCB, and electrically interconnecting the LEDs of each array of LEDs.

14. The method according to claim 12, wherein the step of providing further comprises:
dispensing an encapsulant covering each LED of the array of LEDs.

15. The method according to claim 12, wherein connecting the first and the second opposing connection end portions comprises electrically connecting each of the plurality of filament lines to another one of the plurality of filament lines.

* * * * *